US007697349B2

(12) United States Patent
Lin

(10) Patent No.: US 7,697,349 B2
(45) Date of Patent: Apr. 13, 2010

(54) WORD LINE BOOST CIRCUIT AND METHOD

(75) Inventor: Yung-Feng Lin, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 223 days.

(21) Appl. No.: 11/896,177

(22) Filed: Aug. 30, 2007

(65) Prior Publication Data
US 2009/0058508 A1 Mar. 5, 2009

(51) Int. Cl.
*G11C 5/01* (2006.01)

(52) U.S. Cl. .......................... 365/189.09; 365/189.11; 365/233.5; 365/241

(58) Field of Classification Search ............ 365/189.11, 365/189.09, 233.5, 241
See application file for complete search history.

(56) References Cited

U.S. PATENT DOCUMENTS

| 6,141,262 | A | * | 10/2000 | Sudo | 365/189.09 |
| 6,628,555 | B2 | * | 9/2003 | Kondo et al. | 365/189.09 |
| 7,154,789 | B2 | * | 12/2006 | Kim et al. | 365/189.09 |

* cited by examiner

*Primary Examiner*—Pho M. Luu
(74) *Attorney, Agent, or Firm*—Bacon & Thomas, PLLc

(57) ABSTRACT

A word line boost circuit includes a first pump circuit, a first transistor, a voltage detection circuit and a second pump circuit. The first pump circuit provides a gate boosted signal according to an address transfer detection (ATD) signal. The first transistor has a control terminal for receiving the gate boosted signal and a second terminal coupled to a target word line. The voltage detection circuit is for detecting a voltage level of the gate boosted signal and accordingly outputting a detection signal. The second pump circuit is for outputting a boost signal to a first terminal of the first transistor according to a voltage level of the detection signal. The boost signal boosts the target word line via the turned-on first transistor.

13 Claims, 7 Drawing Sheets

WORD LINE BOOST CIRCUIT AND METHOD

BACKGROUND OF THE INVENTION

1. Field of the Invention

The invention relates in general to a word line boost circuit and method, and more particularly to a word line boost circuit and method capable of improving a reading speed.

2. Description of the Related Art

Referring to FIG. 1, a circuit diagram of a conventional word line boost circuit is shown. A word line boost circuit 100 includes a first pump circuit 110, a first transistor M1, a second transistor M2, a zener diode 120, a first switch Q1, and a second pump circuit 130. The first pump circuit 110 receives an address transfer detection (ATD) signal and outputs a gate boosted signal AVXVF. The first pump circuit 110 substantially includes three stages of sub-pump circuits for sequentially increasing a voltage level of the gate boosted signal AVXVF. The first transistor M1 has a control terminal for receiving the gate boosted signal AVXVF and a second terminal coupled to a target word line TWL.

The second transistor M2 has a first terminal coupled to the control terminal of the first transistor M1. A control terminal of the second transistor M2 is coupled to the first terminal of the second transistor M2. The zener diode 120 has a first end coupled to a second terminal of the second transistor M2. The first switch Q1 has a control terminal for receiving the ATD signal ATD, a first terminal coupled to a second end of the zener transistor 120, and a second terminal for receiving a ground voltage GND. The second pump circuit 130 receives a trigger signal ATDBOOST and accordingly outputs a boost signal AVXBST to boost the target word line TWL.

The word line boost circuit 100 achieves the purpose of boosting the target word line TWL by timing control. Referring to FIG. 2, a timing diagram of the word line boost circuit 100 is shown. In the word line boost circuit 100, when the voltage level of the gate boosted signal AVXVF is equal to a predetermined voltage, due to the component characteristic of the zener diode 120, the voltage level of the gate boosted signal AVXVF can be stably maintained to the predetermined voltage. The predetermined voltage is a sum of a threshold voltage of the second transistor M2 and a voltage drop across the zener diode 120. Therefore, the time (t2-t1) for the voltage level of the ATD signal ATD to be kept at a high level H should be long enough such that the voltage level of the gate boosted signal AVXVF can be successfully lifted up to the predetermined voltage by the first pump circuit 110.

After the time t2, that is, after the voltage level of the gate boosted signal AVXVF has been the predetermined voltage, the voltage level of the trigger signal ATDBOOST is transferred to the high level H and the second pump circuit 130 is triggered to lift up the boost signal AVXBST to boost the target word line TWL. However, the conventional word line boost circuit 100 can increase the voltage level of the trigger signal ATDBOOST to the high level H only after the time t2, which wastes much time.

SUMMARY OF THE INVENTION

The invention is directed to a word line boost circuit and method. Instead of using the conventional timing control method, using a boost signal generated dynamically can improve the reading speed.

According to a first aspect of the present invention, a word line boost circuit is provided. The word line boost circuit comprises a first pump circuit, a first transistor, a voltage detection circuit, and a second pump circuit. The first pump circuit is for providing a gate boosted signal according to an address transfer detection (ATD) signal. The first transistor has a control terminal for receiving the gate boosted signal and a second terminal coupled to a target word line. The voltage detection circuit is for detecting a voltage level of the gate boosted signal and accordingly outputting a detection signal. The second pump circuit is for outputting a voltage boosting signal to a first terminal of the first transistor according to a voltage level of the detection signal. The voltage boosting signal boosts a voltage of the target word line via the turned-on first transistor.

According to a second aspect of the present invention, a word line boost method is provided. First, provide a gate boosted signal via a first pump circuit according to an ATD signal. Following that, detect a voltage level of the gate boosted signal and accordingly output a detection signal. Afterward, trigger a second pump circuit to life up a voltage level of a voltage boosting signal to boost a target word line according to a voltage level of the detection signal.

The invention will become apparent from the following detailed description of the preferred but non-limiting embodiments. The following description is made with reference to the accompanying drawings.

DETAILED DESCRIPTION OF THE INVENTION

The invention is directed to a word line boost circuit and method. Dynamically generating a boost signal by an extra voltage detection circuit instead of transferring the boost signal by timing control can reduce the waiting time for boosting the word line and improve the reading speed.

Figure 1:
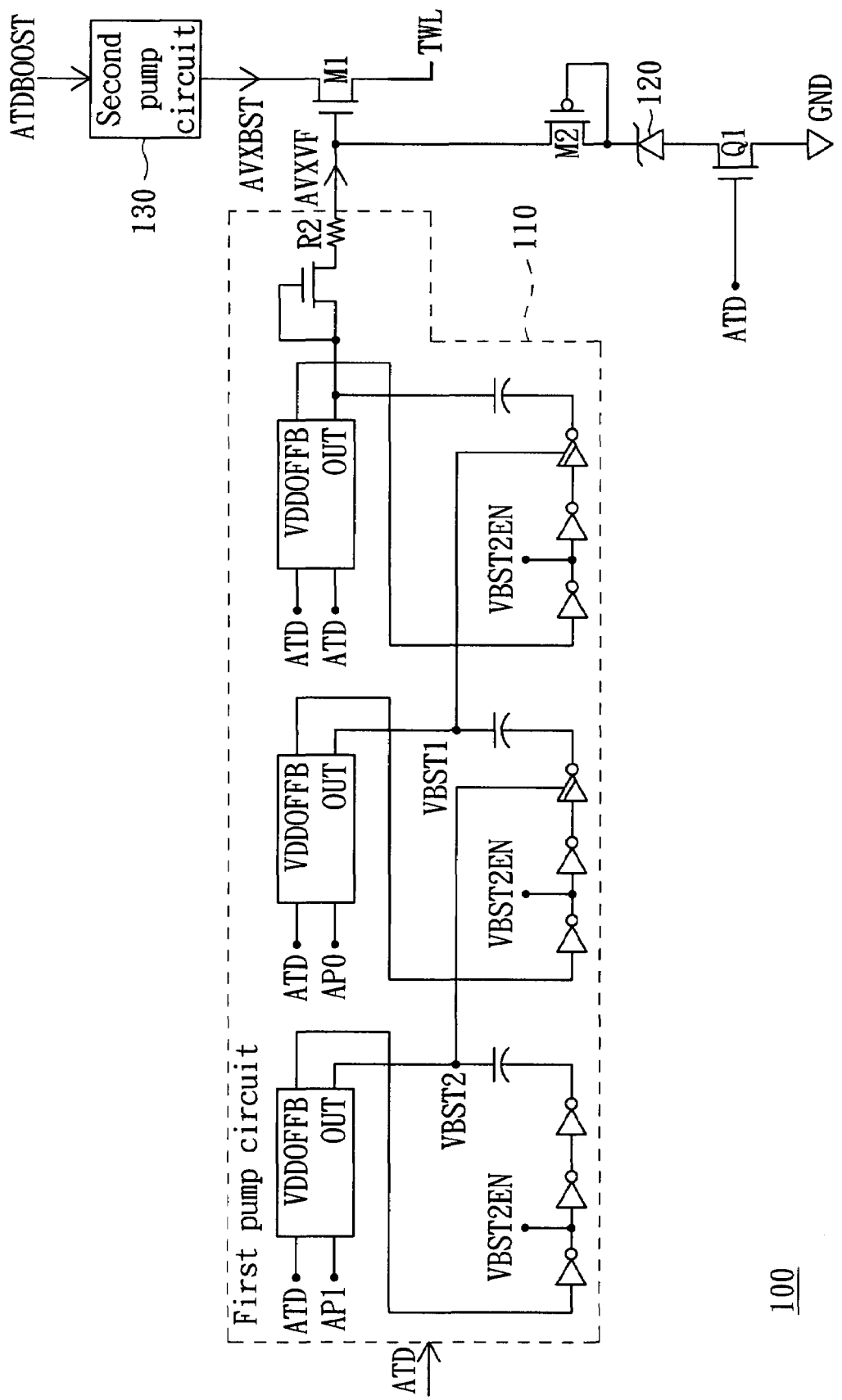
FIG. 1 is a circuit diagram of a conventional word line boost circuit.
Figure 2:
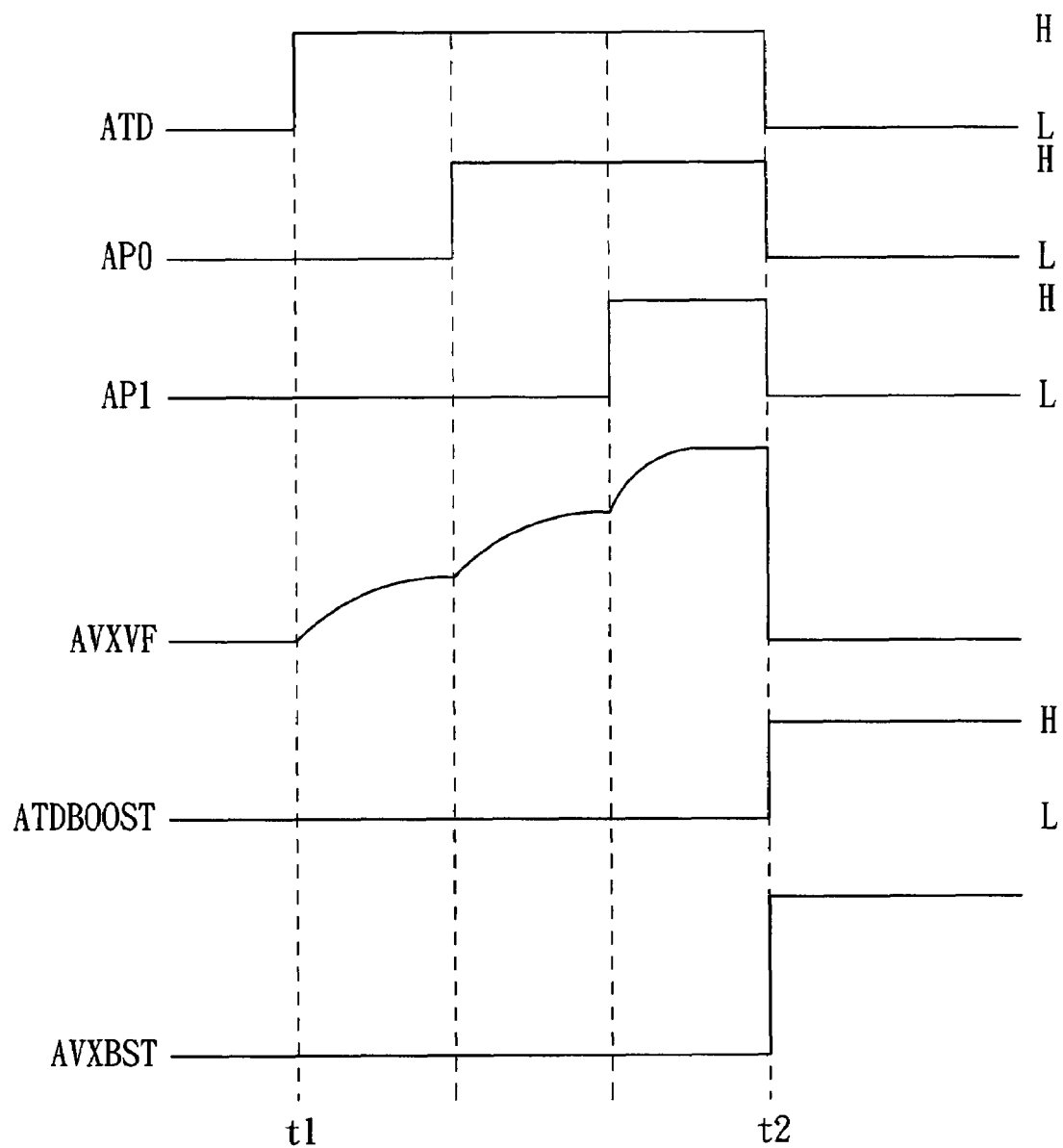
FIG. 2 is a timing diagram of the word line boost circuit in FIG. 1.
Figure 3:
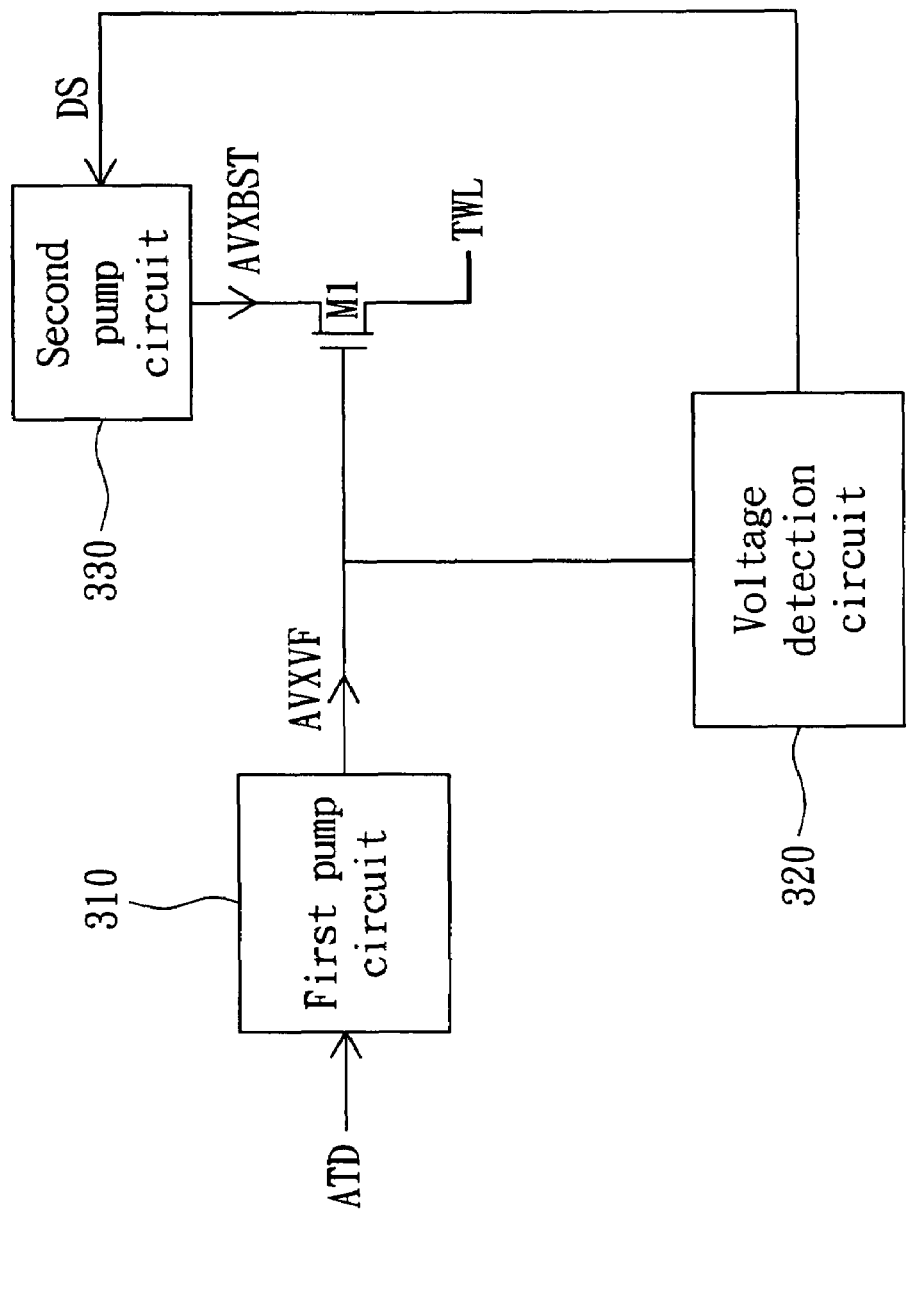
FIG. 3 is a block diagram of a word line boost circuit according to a preferred embodiment of the invention.

Referring to FIG. 3, a block diagram of a word line boost circuit according to a preferred embodiment of the invention is shown. A word line boost circuit 300 includes a first pump circuit 310, a first transistor M1, a voltage detection circuit 320 and a second pump circuit 330. The first pump circuit 310 provides a gate boosted signal AVXVF according to an address transfer detection (ATD) signal ATD. The first transistor M1 has a control terminal for receiving the gate boosted signal AVXVF and a second terminal coupled to a target word line TWL. The voltage detection circuit 320 is for detecting a voltage level of the gate boosted signal AVXVF and accordingly outputting a detection signal DS.

The second pump circuit 330 outputs a boost signal AVXBST to a first terminal of the first transistor M1 according to the voltage level of the detection signal DS. The boost signal AVXBST boosts the target word line TWL via the turned-on first transistor M1. When the voltage level of the ATD signal ATD is transferred to a high level, the first pump circuit 310 starts to lift up the voltage level of the gate boosted signal AVXVF. When the voltage level of the gate boosted signal AVXVF is raised to about a predetermined voltage, the voltage level of the detection signal DS is transferred to the high level. The detection signal DS then triggers the second pump circuit 330 to lift up the voltage level of the boost signal AVXBST to boost the target word line TWL.

Figure 4:
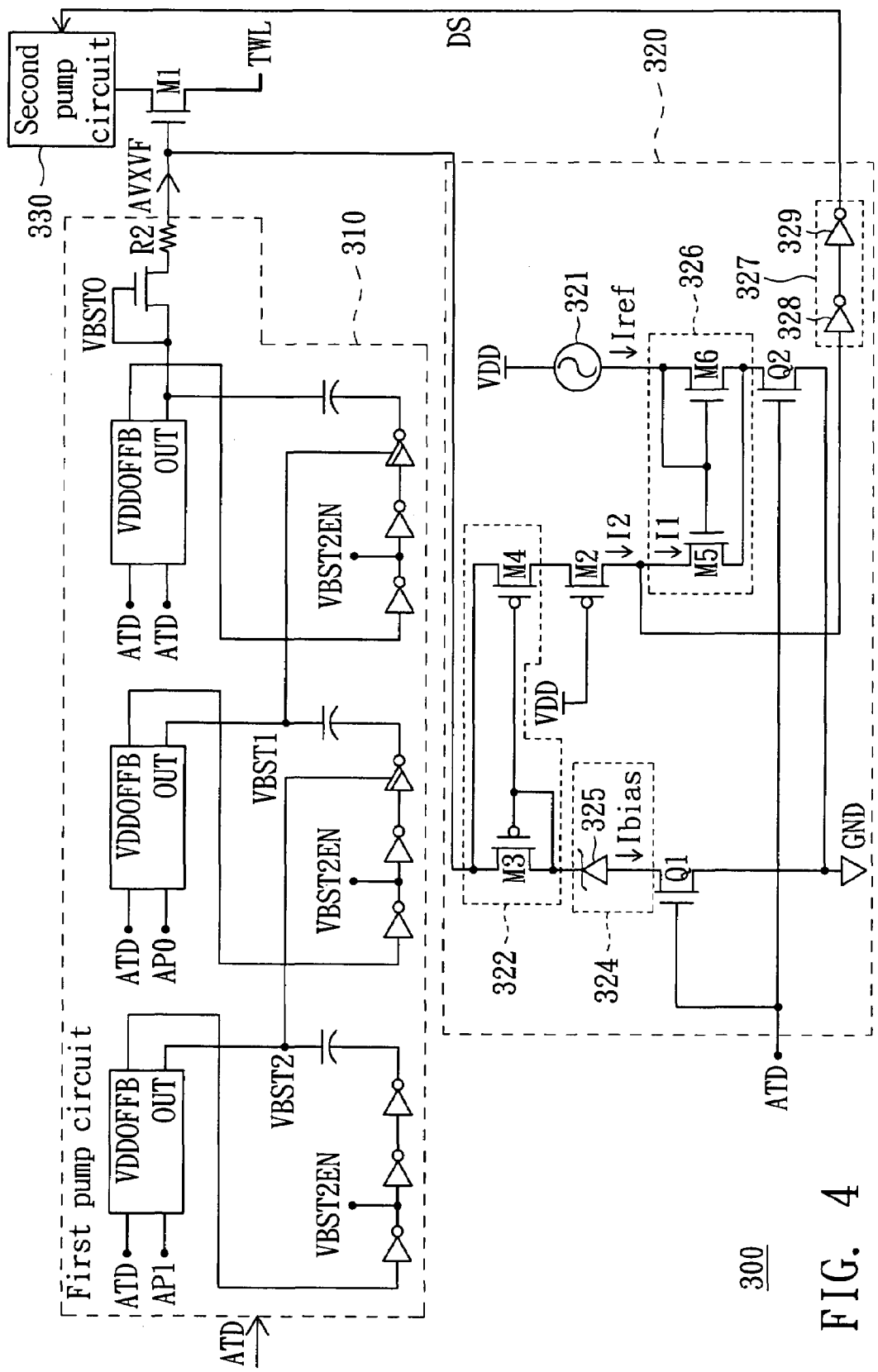
FIG. 4 is a circuit diagram of a word line boost circuit according to a preferred embodiment of the invention.

Referring to FIG. 4, a circuit diagram of the word line boost circuit 300 according to a preferred embodiment of the invention is shown. A word line boost circuit 300 includes a first pump circuit 310, a first transistor M1, a voltage detection circuit 320 and a second pump circuit 330. The voltage detection circuit 320 includes a current source 321, a first current mirror circuit 322, a clamp circuit 324, a first switch Q1, a second transistor M2, a second current mirror circuit 326, a second switch Q2 and a buffer unit 327.

The current source 321 is for providing a reference current Iref. The first current mirror circuit 322 is coupled to a control terminal of the first transistor M1. The first current mirror circuit 322 includes a third transistor M3 and a fourth transistor M4. The third transistor M3 has a first terminal coupled to the control terminal of the first transistor M1. A second terminal of the third transistor M3 is coupled to a control terminal of the third transistor M3 and the clamp circuit 324. The fourth transistor M4 has a control terminal coupled to the control terminal of the third transistor M3, a first terminal coupled to the first terminal of the third transistor M3, and a second terminal coupled to a first terminal of the second transistor M2.

The clamp circuit 324 includes a zener diode 325. The zener diode 325 has a first end coupled to the first current mirror circuit 322 and a second end coupled to a first terminal of the first switch Q1. The first switch Q1 has a control terminal for receiving the ATD signal ATD and a second terminal for receiving a ground voltage GND. A control terminal of the second transistor M2 is for receiving an operation voltage VDD and the first terminal of the second transistor M2 is coupled to the first current mirror circuit 322.

The second current mirror circuit 326 is coupled to the current source 321 and a second terminal of the second transistor M2. The second current mirror circuit 326 includes a fifth transistor M5 and a sixth transistor M6. A first terminal of the fifth transistor M5 is coupled to the second terminal of the second transistor M2. A first terminal of the sixth transistor M6 is coupled to the current source 321. A control terminal of the sixth transistor M6 is coupled to a control terminal of the fifth transistor M5 and the first terminal of the sixth transistor M6.

The second switch Q2 has a control terminal for receiving the ATD signal ATD, a first terminal coupled to a second terminal of the sixth transistor M6 and a second terminal for receiving the ground voltage GND. The buffer unit 327 is coupled to the second terminal of the second transistor M2. The buffer unit 327 includes a first inverter 328 and a second inverter 329. The first inverter 328 has input terminal coupled to the second terminal of the second transistor M2. The second inverter 329 has an input terminal coupled to an output terminal of the first inverter 328 and an output terminal for outputting the detection signal DS.

For example, in FIG. 4, the first transistor M1, the fifth transistor M5, the sixth transistor M6, the first switch Q1 and the second switch Q2 are n-type metal oxide semiconductor (NMOS) transistors and the second transistor M2, the third transistor M3 and the fourth transistor M4 are p-type metal oxide semiconductor (PMOS) transistors.

Figure 5:
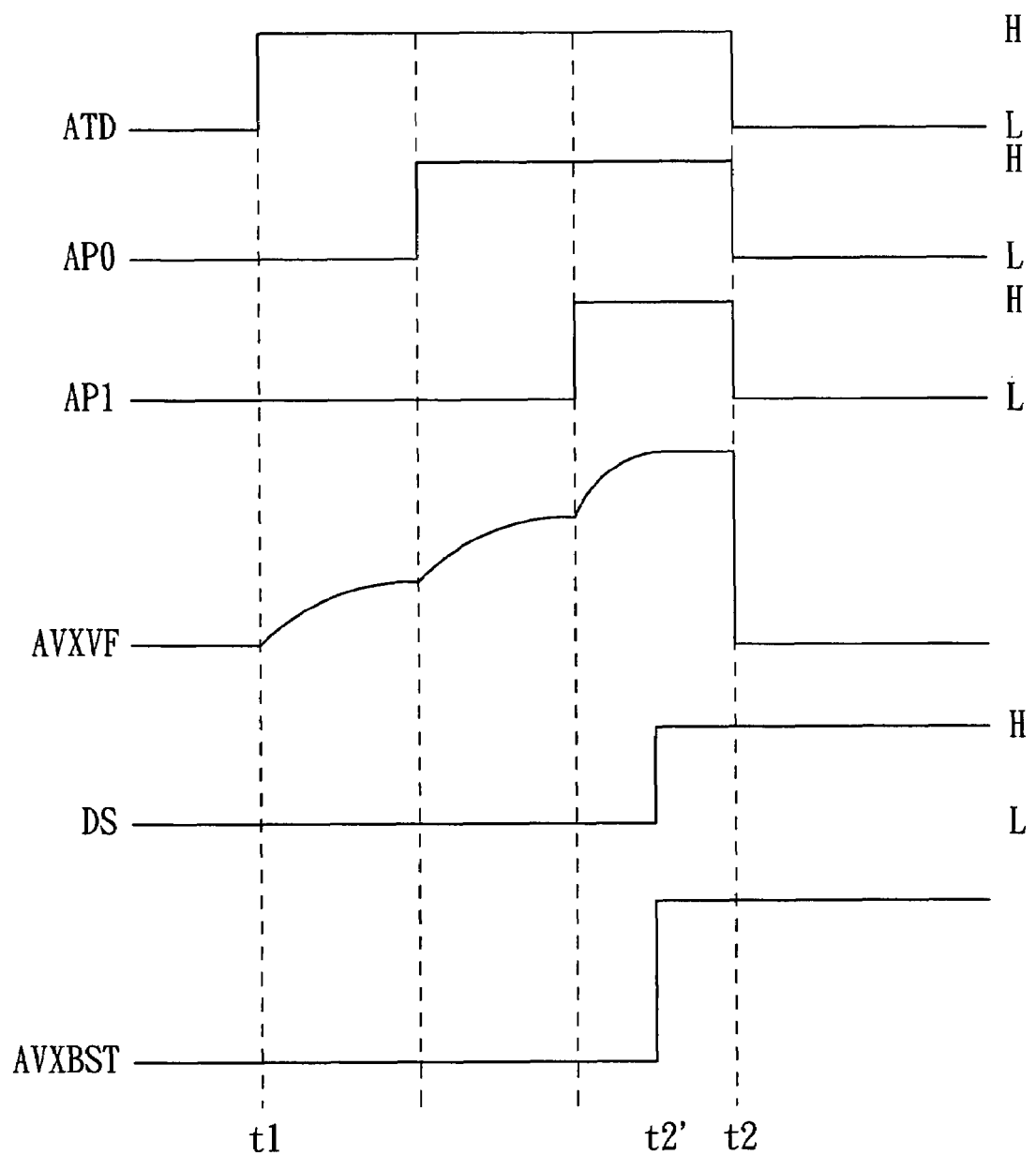
FIG. 5 is a timing diagram of the word line boost circuit in FIG. 3 according to the preferred embodiment of the invention.

Referring to FIG. 5, a timing diagram of the word line boost circuit 300 according to the preferred embodiment of the invention is shown. At the time t1 when an address for reading data is changed, the voltage level of the ATD signal ATD is transferred to the high level H, the first switch Q1 and second switch Q2 are turned on, and the second current mirror circuit 326 duplicates the reference current Iref to generate a first current I1. At the same time, the first pump circuit 310 starts to lift up the voltage level of the gate boosted signal AVXVF. When the voltage level of the gate boosted signal AVXVF is still lower than the predetermined voltage, which is a sum of a threshold voltage of the third transistor M3 and a voltage drop across the zener diode 325, there is no current flowing through the zener diode 325 so that there is no current flowing through the fourth transistor M4. The buffer unit 327 outputs the detection signal DS according to the first current I1 and the voltage level of the detection signal DS is a low level L. Therefore, the voltage level of the boost AVXBST is not lifted by the second pump circuit 330.

At the time t2', the voltage level of the gate boosted signal AVXVF is lifted up to about the predetermined voltage by the first pump circuit 310. At the time, due to the component characteristic of the zener diode 325, the voltage level of the gate boosted signal AVXVF can be stably maintained to be the predetermined voltage. At the same time, the zener diode 325 will have a bias current Ibias. The first current mirror circuit 322 duplicates the bias current Ibias to generate a second current I2, and the second current I2 flows through the turned-on second transistor M2. Meanwhile, the second transistor M2 may be used to avoid a voltage level of an input terminal of the first inverter 328 too high.

Figure 6A:
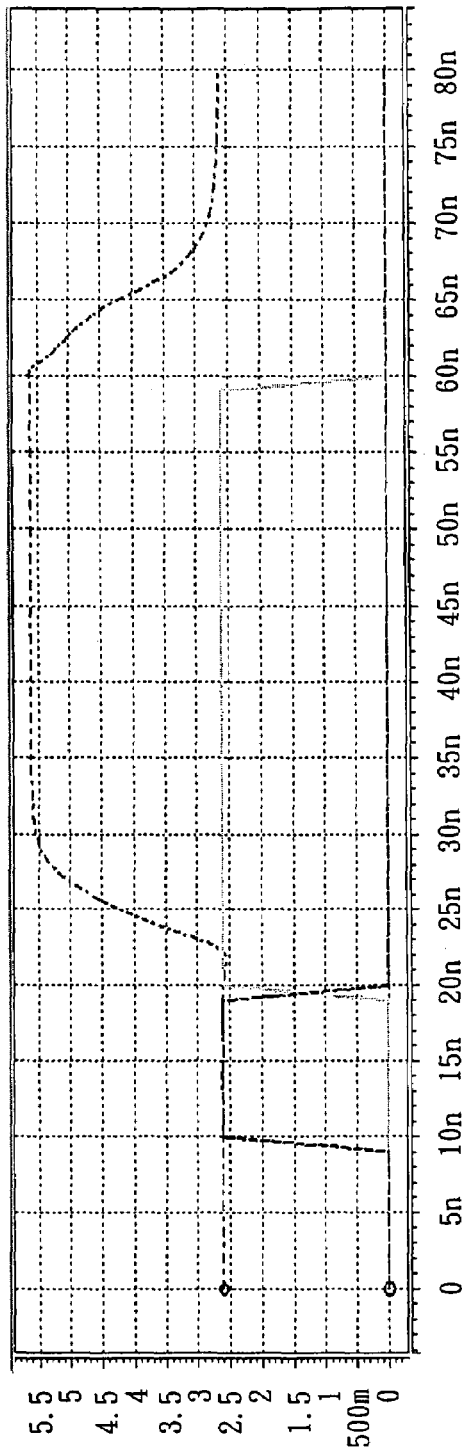
FIG. 6A is a waveform diagram of the conventional word line boost circuit in FIG. 1.
Figure 6B:
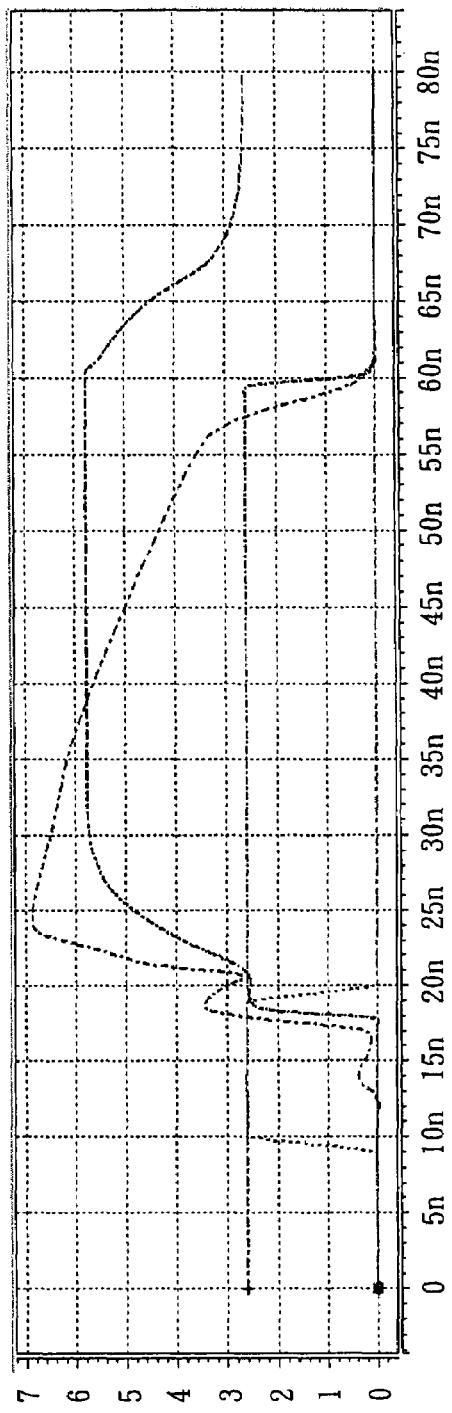
FIG. 6B is a waveform diagram of the word line boost circuit in FIG. 3 according to the preferred embodiment of the invention.

If the second current I2 is larger than the first current I1, the buffer unit 327 outputs the detection signal DS to the second pump circuit 330 according to the second current I2, and the voltage level of the detection signal DS is the high level H. The second pump circuit 330 is then triggered to lift up the voltage level of the boost signal AVXBST to boost the target word line TWL. The word line boost circuit 300 provided by the above embodiment can lift up the voltage level of the boost signal AVXBST to boost the target word line TWL as long as the voltage level of the gate boosted signal AVXVF is equal to a sum of the threshold voltage of the third transistor M3 and a voltage drop across the zener diode 325. Compared to the conventional word line boost circuit 100, the word line boost circuit 300 saves about 2 ns for each operation for word line boost. Referring to FIGS. 6A and 6B, waveform diagrams of the conventional word line boost circuit 100 and the word line boost circuit 300 according to the preferred embodiment of the invention are respectively shown.

Figure 7:
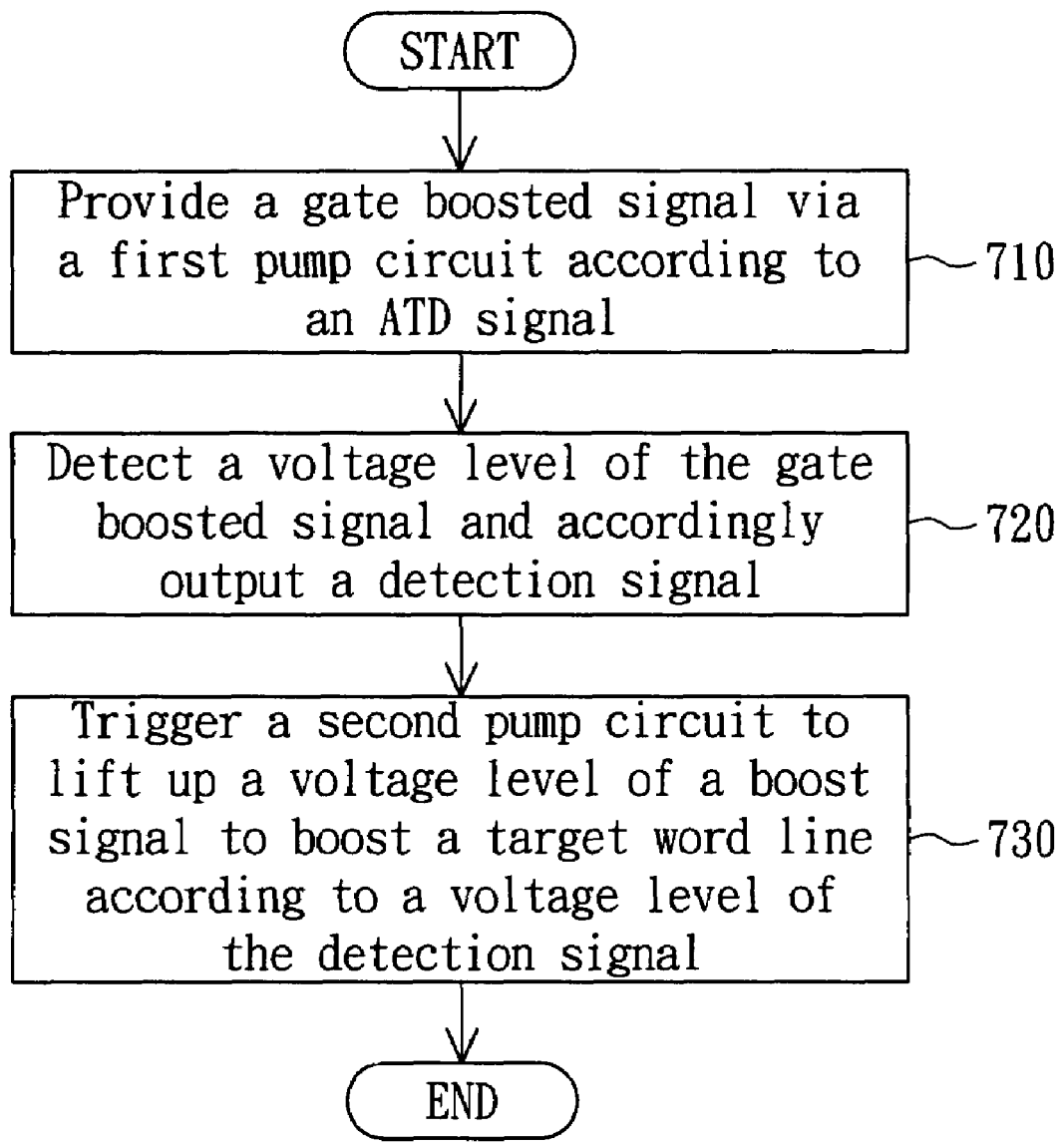
FIG. 7 is a flow chart of the word line boost method according to the preferred embodiment of the invention.

The invention also discloses a word line boost method which can reduce the waiting time for boosting the word line by detecting the voltage level of the gate boosted signal. Referring to FIG. 7, a flow chart of the word line boost method according to the preferred embodiment of the invention is shown. First, in step 710, a gate boosted signal is provided via a first pump circuit according to an ATD signal. Following that, in step 720, a voltage level of the gate boosted signal is detected and a detection signal is accordingly outputted. Next, in step 730, a second pump circuit is triggered to lift up a voltage level of a boost signal to boost a target word line according to a voltage level of the detection signal. The detailed operation principle of the word line boost method disclosed by the invention has been described in the above embodiment of the word line boost circuit and therefore is not repeated hereinafter.

In the word line boost circuit and method disclosed by the above embodiment of the invention, by using an extra voltage detection circuit, a bias current and a reference current are compared to generate a detection signal, and then a voltage level of a boost signal is transferred dynamically instead of being controlled by timing, such that the waiting time for boosting the word line is reduced, and the reading speed is improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A word line boost circuit, comprising:
    a first pump circuit for providing a gate boosted signal according to an address transfer detection (ATD) signal;
    a first transistor having a control terminal for receiving the gate boosted signal and a second terminal coupled to a target word line;
    a voltage detection circuit for detecting a voltage level of the gate boosted signal and accordingly outputting a detection signal; and
    a second pump circuit for outputting a boost signal to a first terminal of the first transistor according to a voltage level of the detection signal, wherein the boost signal boosts the target word line via the turned-on first transistor.

2. The word line boost circuit according to claim 1, wherein when a voltage level of the ATD signal is transferred to a high level, the first pump circuit lifts up the voltage level of the gate boosted signal; when the voltage level of the gate boosted signal is equal to a predetermined voltage, the voltage level of the detection signal is transferred to the high level and triggers the second pump circuit to lift up a voltage level of the boost signal to boost the target word line.

3. The word line boost circuit according to claim 2, wherein the voltage detection circuit comprises:
    a first current mirror circuit coupled to the control terminal of the first transistor;
    a clamp circuit coupled to the first current mirror circuit;
    a first switch having a control terminal for receiving the ATD signal, a first terminal coupled to the clamp circuit, and a second terminal for receiving a ground voltage;
    a second transistor having a control terminal for receiving an operation voltage and a first terminal coupled to the first current mirror circuit;
    a current source for providing a reference current;
    a second current mirror circuit coupled to the current source and a second terminal of the second transistor;
    a second switch having a control terminal for receiving the ATD signal, a first terminal coupled to the second current mirror circuit, and a second terminal for receiving the ground voltage; and
    a buffer unit coupled to the second terminal of the second transistor for outputting the detection signal.

4. The word line boost circuit according to claim 3, wherein the first current mirror circuit comprises:
    a third transistor having a first terminal coupled to the control terminal of the first transistor, wherein a second terminal of the third transistor is coupled to a control terminal of the third transistor and the clamp circuit; and
    a fourth transistor having a control terminal coupled to the control terminal of the third transistor, a first terminal coupled to the first terminal of the third transistor and a second terminal coupled to the first terminal of the second transistor.

5. The word line boost circuit according to claim 4, wherein the first transistor, the first switch and the second switch are n-type metal oxide semiconductor (NMOS) transistors and the second transistor, the third transistor and the fourth transistor are p-type metal oxide semiconductor (PMOS) transistors.

6. The word line boost circuit according to claim 5, wherein the clamp circuit comprises a zener diode, the zener diode has a first end coupled to the first current mirror circuit and a second end coupled to the first terminal of the first switch, when the voltage level of the gate boosted signal is equal to the predetermined voltage, the zener diode is for stabilizing the voltage level of the gate boosted signal.

7. The word line boost circuit according to claim 6, wherein the predetermined voltage is a sum of a threshold voltage of the third transistor and a voltage drop across the zener diode.

8. The word line boost circuit according to claim 7, wherein when the voltage level of the ATD signal is transferred to the high level, the first switch and the second switch are turned on and the second current mirror circuit duplicates the reference current to generate a first current.

9. The word line boost circuit according to claim 8, wherein if the voltage level of the gate boosted signal is equal to the predetermined voltage, the clamp circuit has a bias current, the first current mirror circuit duplicates the bias current to generate a second current, when the second current is larger than the first current, the buffer unit outputs the detection signal according to the second current and the voltage level of the detection signal is the high level, the second pump circuit is triggered to lift up the voltage level of the boost signal to boost the target word line.

10. The word line boost circuit according to claim 3, wherein the buffer circuit comprises:
    a first inverter having an input terminal coupled to the second terminal of the second transistor;
    a second inverter having an input terminal coupled to an output terminal of the first inverter and an output terminal for outputting the detection signal.

11. A word line boost method, comprising:
    providing a gate boosted signal via a first pump circuit according to an address transfer detection (ATD) signal;
    detecting a voltage level of the gate boosted signal and accordingly outputting a detection signal; and
    triggering a second pump circuit to output a boost signal according to the detection signal and providing the boost signal to a target word line under control of the gate boosted signal.

12. The word line boost method according to claim 11, further comprising:
    when the voltage level of the ATD signal is transferred to a high level, lifting up the voltage level of the gate boosted signal by the first pump circuit; and
    when the voltage level of the gate boosted signal is equal to a predetermined voltage, transferring the voltage level of the detection signal to the high level, and triggering the second pump circuit to lift up the voltage level of the boost signal to boost the target word line.

13. The word line boost method according to claim 12, wherein when the voltage level of the gate boosted signal is equal to the predetermined voltage, the voltage level of the gate boosted signal is stably maintained.

* * * * *